United States Patent
Hongoh et al.

(10) Patent No.: US 6,675,737 B2
(45) Date of Patent: Jan. 13, 2004

(54) PLASMA PROCESSING APPARATUS

(75) Inventors: Toshiaki Hongoh, Nirasaki (JP); Tetsu Osawa, Kanagawa (JP); Masaki Hirayama, Sendai (JP); Tadahiro Ohmi, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 206 days.

(21) Appl. No.: 10/020,274

(22) Filed: Dec. 18, 2001

(65) Prior Publication Data

US 2002/0076367 A1 Jun. 20, 2002

(30) Foreign Application Priority Data

Dec. 19, 2000 (JP) .......................... 2000-386101

(51) Int. Cl.$^7$ .......................... C23C 16/00; H05H 1/00
(52) U.S. Cl. .......................... 118/723 MW; 156/345.41
(58) Field of Search .......................... 118/723 MW, 118/723 MA, 723 AN; 156/345.36, 345.41, 345.42; 315/111.21

(56) References Cited

U.S. PATENT DOCUMENTS 6,325,018 B1 * 12/2001 Hongoh ................ 118/723 AN
6,347,602 B2 * 2/2002 Goto et al. ............ 118/723 MW

FOREIGN PATENT DOCUMENTS

| JP | 3-191073 | 8/1991 |
| JP | 5-343334 | 12/1993 |
| JP | 9-181052 | 7/1997 |

* cited by examiner

*Primary Examiner*—Parviz Hassanzadeh
(74) *Attorney, Agent, or Firm*—Finnegan Henderson Farabow Garrett & Dunner, L.L.P.

(57) ABSTRACT

A plasma processing apparatus includes a process chamber, an insulating plate airtightly attached to the ceiling of the process chamber, a mount base placed in the process chamber for mounting thereon a workpiece to be processed, a planar antenna member placed above the insulating plate and including a microwave radiation hole for transmitting therethrough microwave used for generating plasma, the microwave transmitted through the insulating plate into the process chamber, and a wave-delay member placed above the planar antenna member for reducing the wavelength of microwave. The insulating plate has its peripheral end formed into an uneven shape with depressions and protrusions for causing, reflected waves of the microwave propagated through the insulating plate from the center and in the radial direction of the insulating plate, to cancel out each other.

9 Claims, 4 Drawing Sheets

PLASMA PROCESSING APPARATUS

BACKGROUND OF THE INVENTION

1. Field of the Invention

The present invention relates to a plasma processing apparatus used for processing semiconductor wafers and the like by the action of a plasma generated by microwave.

2. Description of the Background Art

In recent years, semiconductor products have been increased in density and reduced in size to a great degree. Accordingly, some manufacturing processes of the semiconductor products employ a plasma processing apparatus for such processing as film deposition, etching and ashing. In particular, there is a tendency to use a microwave plasma apparatus since the microwave plasma apparatus can produce a plasma in a stable manner even in a high-vacuum state of a relatively low pressure, specifically from about 0.1 mTorr (13.3 mPa) to several tens of mTorr (several Pa), by using the microwave or a combination of the microwave and a magnetic field from a ring-shaped coil to produce a high-density plasma.

Such a plasma processing apparatus is disclosed for example in Japanese Patent Laying-Open Nos. 3-191073 and 5-343334 and Japanese Patent Laying-Open No. 9-181052 filed by the applicant of the present application. A general plasma processing apparatus using the microwave is described briefly below in conjunction with FIGS. 6 and 7. FIG. 6 shows a structure of a conventional and generally employed plasma processing apparatus and FIG. 7 is a plan view of an insulating plate.

Referring to FIG. 6, this plasma processing apparatus 2 includes a process chamber 4 which can be evacuated, a mount base 6 on which a semiconductor wafer W is mounted, and an insulating plate 8 provided in an airtight manner on a ceiling opposite to mount base 6. Insulating plate 8 transmitting microwave is formed of aluminum nitride or the like in the shape of a disk as shown in FIG. 7, for example.

Plasma processing apparatus 2 further includes, on the upper side of insulating plate 8, a planar antenna member 10 in the shape of a disk with a thickness of several millimeters and a wave-delay member 12 formed of a dielectric for example for reducing the wavelength of microwave in the radial direction of planar antenna member 10 as required. In addition, plasma processing apparatus 2 includes a ceiling cooling jacket 16 above wave-delay member 12 that has a cooling channel 14 formed for flowing a cooling water therein in order to cool wave-delay member 12 and the like. Antenna member 10 includes a great number of microwave radiation holes 18 that are through holes nearly circular in shape. In general, microwave radiation holes 18 are arranged concentrically or spirally. An internal cable 22 of a coaxial waveguide 20 is connected to the central part of planar antenna member 10 for guiding a microwave of 2.45 GHz for example produced by a microwave generator (not shown). The microwave is transmitted radially in the radial direction of antenna member 10 and also discharged from microwave radiation holes 18 provided in antenna member 10 to be transmitted downward through insulating plate 8 into process chamber 4. The microwave generates a plasma in process chamber 4 for performing a predetermined plasma process such as etching and film deposition for a semiconductor wafer.

Insulating plate 8 demarcating the ceiling of process chamber 4 is made of aluminum nitride (AlN) for example, having in general a relatively low dielectric loss in order to transmit most of the microwave downward. Referring to FIG. 7, however, there is a tendency that a part of the microwave that is indicated by M1 is propagated radially from a central part C1 of insulating plate 8 in the radial direction thereof, reflected from the peripheral end of insulating plate 8, and accordingly returned as a reflected wave M2 to central part C1 of insulating plate 8. Consequently, reflected waves M2 concentrate at central part C1, so that the electric field of the microwave at and around central part C1 of insulating plate 8 as well as the density of accordingly produced plasma in a central region of a process space S tend to be higher than those of the surrounding regions respectively. Then, a portion of semiconductor wafer W that is located at and in the vicinity of the center thereof is plasma-processed to a greater degree than the region surrounding that portion. A resultant problem is that, in some cases, a sufficiently high planar uniformity of the plasma process is impossible to maintain.

Such a problem concerning the reflected microwave not only arises for insulating plate 8 but also similarly arises for planar antenna member 10 and wave-delay member 12, while this problem may occur to different degrees respectively. For example, the dimension of microwave radiation holes 18 of planar antenna member 10 and the pitch between the arranged holes, for example, are designed, on a calculational basis, to prevent the microwave radiated from a central part of antenna member 10 to the periphery thereof from being reflected and returned from the peripheral end of the antenna member to the central part thereof. However, because of a difference between the actual dielectric constant and a designed constant of wave-delay member 12, or for other possible reasons, at the point of time when the microwave is propagated to the outermost microwave radiation holes, all of the microwave is not radiated downward but a part thereof is reflected from the peripheral end of the antenna member and returned to the central part of the antenna member. This is inevitable and thus such a problem is desirably solved as soon as possible.

SUMMARY OF THE INVENTION

The present invention has been made in consideration of such a problem in order to effectively solve the problem. One object of the invention is to provide a plasma processing apparatus with remarkably lessened adverse effects of the reflected wave propagated in the planar direction through an insulating plate for example that seals a ceiling portion of a process chamber.

A plasma processing apparatus according to one aspect of the present invention includes a process chamber having an opened ceiling and an internal space which can be evacuated, an insulating plate airtightly attached to the ceiling of the process chamber, a mount base placed in the process chamber for mounting thereon a workpiece to be processed, a planar antenna member placed above the insulating plate and including a microwave radiation hole for transmitting therethrough microwave used for generating plasma, the microwave transmitted through the insulating plate into the process chamber, a wave-delay member placed above the planar antenna member for decreasing the wavelength of microwave, and gas supply means for supplying a predetermined gas into the process chamber. The insulating plate has its peripheral end formed into an uneven shape with depressions and protrusions for causing, reflected waves of the microwave propagated through the insulating plate from the center and in the radial direction of the insulating plate, to cancel out each other.

In the plasma processing apparatus with the structure as described above, the microwave propagated radially through the insulating plate in the process chamber is reflected from the depressions and protrusions of the peripheral end of the insulating plate, so that resultant reflected waves cancel out each other. It is thus possible to considerably lessen adverse influences of the reflected waves and accordingly improve the planar uniformity of plasma processing for the workpiece to be processed.

Preferably, the depressions and protrusions of the uneven shape each have a length in the radial direction of the insulating plate, and the length is substantially equal to an odd multiple of a quarter of the wavelength of the microwave propagated through the insulating plate.

Still preferably, a pitch, in the circumferential direction of the insulating plate, between the depressions or protrusions of the uneven shape substantially ranges from a quarter to twice as long as the wavelength of the microwave propagated through the insulating plate.

A plasma processing apparatus according to another aspect of the invention includes a process chamber having an opened ceiling and an internal space which can be evacuated, an insulating plate airtightly attached to the ceiling of the process chamber, a mount base placed in the process chamber for mounting thereon a workpiece to be processed, a planar antenna member placed above the insulating plate and including a microwave radiation hole for transmitting therethrough microwave used for generating plasma, the microwave transmitted through the insulating plate into the process chamber, a wave-delay member placed above the planar antenna member for decreasing the wavelength of microwave, and gas supply means for supplying a predetermined gas into the process chamber. The planar antenna member has its peripheral end formed into an uneven shape with depressions and protrusions for causing, reflected waves of the microwave propagated through the planar antenna member from the center and in the radial direction of the insulating plate, to cancel out each other.

In the plasma processing apparatus structured as described above, the microwave propagated radially through the planar antenna member is reflected from the depressions and protrusions of the peripheral end of the planar antenna member, so that resultant reflected waves cancel out each other. It is thus possible to considerably lessen adverse influences of the reflected waves and accordingly improve the planar uniformity of plasma processing for the workpiece to be processed.

Preferably, the depressions and protrusions of the uneven shape each have a length in the radial direction of the planar antenna member, and the length is substantially equal to an odd multiple of a quarter of the wavelength of microwave propagated through the wave-delay member.

Still preferably, a pitch, in the circumferential direction of the planar antenna member, between the depressions or protrusions of the uneven shape substantially ranges from a quarter to twice as long as the wavelength of microwave propagated through the wave-delay member.

A plasma processing apparatus according to still another aspect of the invention includes a process chamber having an opened ceiling and an internal space which can be evacuated, an insulating plate airtightly attached to the ceiling of the process chamber, a mount base placed in the process chamber for mounting thereon a workpiece to be processed, a planar antenna member placed above the insulating plate and including a microwave radiation hole for transmitting therethrough microwave used for generating plasma, the microwave transmitted through the insulating plate into the process chamber, a wave-delay member placed above the planar antenna member for decreasing the wavelength of microwave, and gas supply means for supplying a predetermined gas into the process chamber. The wave-delay member has its peripheral end formed into an uneven shape with depressions and protrusions for causing, reflected waves of microwave propagated through the wave-delay member from the center and in the radial direction of the wave-delay member, to cancel out each other.

In the plasma processing apparatus with the structure as described above, the microwave propagated radially through the wave-delay member for reducing the wavelength of microwave is reflected from the depressions and protrusions of the peripheral end of the wave-delay member, so that resultant reflected waves cancel out each other. It is thus possible to considerably lessen adverse influences of the reflected waves and accordingly improve the planar uniformity of plasma processing for the workpiece to be processed.

Preferably, the depressions and protrusions of the uneven shape each have a length in the radial direction of the wave-delay member, and the length is substantially equal to an odd multiple of a quarter of the wavelength of the microwave propagated through the wave-delay member.

Still preferably, a pitch, in the circumferential direction of the wave-delay member, between the depressions or protrusions of the uneven shape substantially ranges from a quarter to twice as long as the wavelength of the microwave propagated through the wave-delay member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
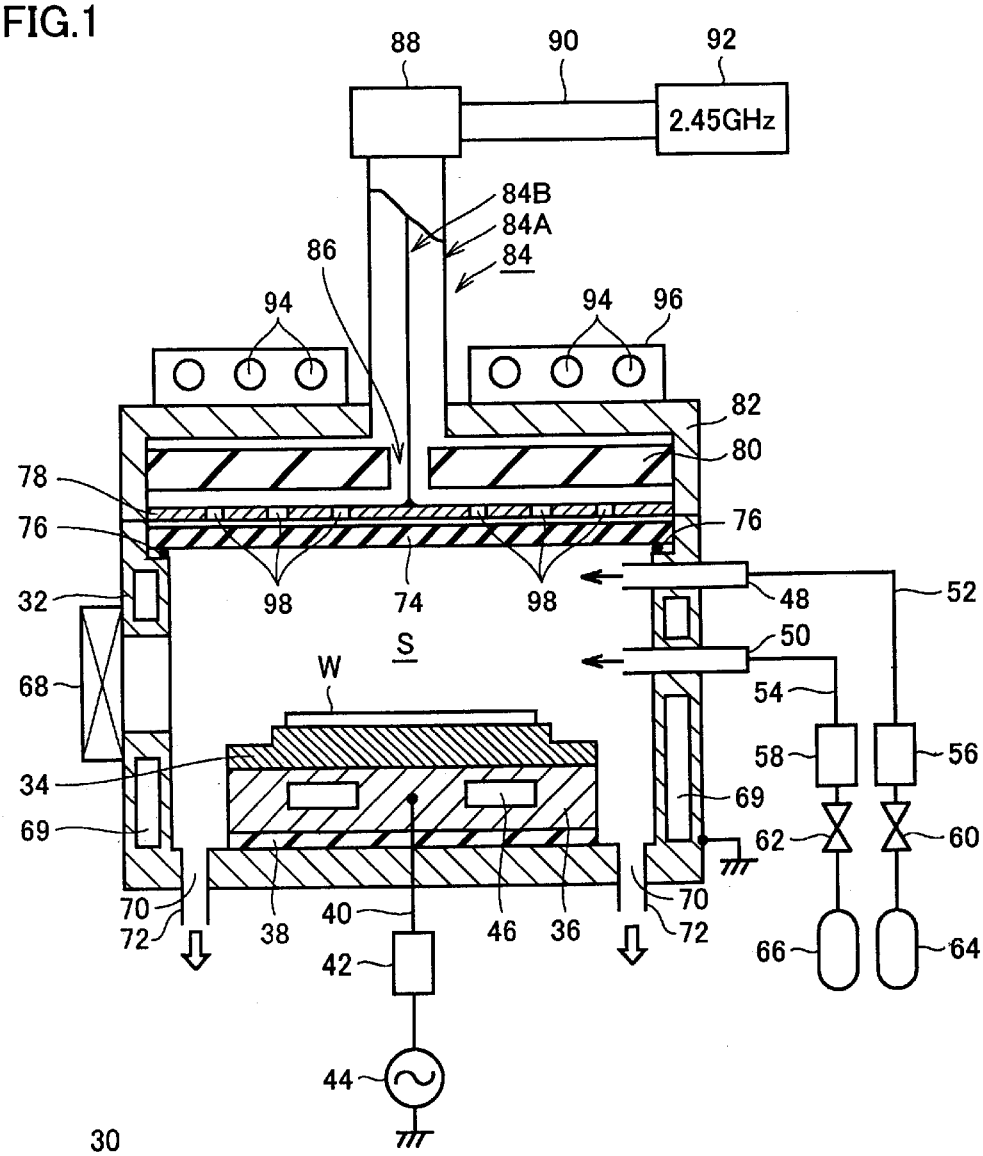
FIG. 1 shows an example of a plasma processing apparatus according to one embodiment of the present invention.

One embodiment of a plasma processing apparatus according to the present invention is now described in detail in conjunction with attached drawings.

According to this embodiment, the plasma processing apparatus is applied to plasma CVD (Chemical Vapor Deposition) processing and accordingly explained. As shown, this plasma processing apparatus 30 includes a process chamber 32 formed entirely in a tubular shape with its sidewall and bottom formed of a conductor such as aluminum, for example. The inside of process chamber 32 is constituted of a sealed process space S.

In process chamber 32, a mount base 34 is housed on which a semiconductor wafer W for example is mounted as a workpiece to be processed. Mount base 34 made of anodized aluminum for example is nearly cylindrical in shape with a flat protrusion. The bottom of mount base 34 is supported by a support base 36 also made of aluminum for example and formed in the shape of a cylinder. Support base 36 is placed within process chamber 32 on the bottom thereof via an insulating member 38.

On the upper side of mount base 34, an electrostatic chuck or clamping mechanism (not shown) is provided for holding a wafer. Mount base 34 is connected, via a feeder line 40, to a matching box 42 and a high-frequency power source 44 for bias of 13.56 MHz for example. In some cases, high-frequency bias power source 44 may not be provided.

Support base 36 supporting mount base 34 includes a cooling jacket 46 where a cooling water flows for cooling a wafer being subjected to plasma processing. As required, a heater may be provided in mount base 34.

The sidewall of process chamber 32 is provided with a plasma gas supply nozzle 48 formed of a quartz pipe for supplying a plasma gas such as argon gas for example into the chamber as well as a process gas supply nozzle 50 formed of a quartz pipe for example for supplying a process gas such as deposition gas for example. These nozzles 48 and 50 are connected respectively to a plasma gas source 64 and a process gas source 66 by respective gas supply paths 52 and 54 via mass-flow controllers 56 and 58 and open-close valves 60 and 62. A deposition gas such as $SiH_4$, $O_2$ and $N_2$ for example may be used as the process gas.

Moreover, a gate valve 68 is provided on the outside of the sidewall of the chamber 32 that opens and closes when a wafer is transported into or out of the chamber, and a cooling jacket 69 is further provided for cooling the sidewall. An exhaust outlet 70 is provided to the bottom of process chamber 32 that is connected to an exhaust path 72 via a vacuum pump (not shown) in order to evacuate the inside of process chamber 32 as required to a predetermined pressure.

The ceiling of process chamber 32 is opened where an insulating plate 74 is provided in an airtight manner via a sealing member 76 such as O-ring. Insulating plate 74 that transmits microwave is made of a ceramic material such as AlN for example with a thickness of approximately 20 mm. This insulating plate 74 is structured as herein described later.

On the upper side of insulating plate 74, a disk-shaped planar antenna member 78 and a wave-delay member 80 of a high-permittivity property are provided. Specifically, planar antenna member 78 is formed to constitute a bottom plate of a waveguide box 82 formed of a hollow cylindrical vessel shaped to be integrated with process chamber 32. Planar antenna member 78 is provided opposite mount base 34 within process chamber 32.

These waveguide box 82 and process chamber 32 are grounded. An outer tube 84A of a coaxial waveguide 84 is connected to the center in the upper portion of waveguide box 82, and an internal cable 84B within waveguide 84 is connected to the central part of planar antenna member 78 through a through hole 86 at the center of wave-delay member 80. Coaxial waveguide 84 is connected to a microwave generator 92 of 2.45 GHz for example via a mode converter 88 and a waveguide 90, for transmitting microwave to planar antenna member 78. The frequency is not limited to 2.45 GHz and another frequency, 8.35 GHz for example, may be used. As the waveguide, a waveguide having a circular or rectangular cross section or coaxial waveguide may be employed. On the upper side of waveguide box 82, a ceiling cooling jacket 96 is provided having a cooling channel 94 formed therein for flowing a cooling water and accordingly cooling wave-delay member 80 and the like. As wave-delay member 80 having the high-permittivity property is provided within waveguide box 82 and on the upper side of planar antenna member 78, the guide wavelength of microwave is decreased by the wavelength-shortening effect of wave-delay member 80. Aluminum nitride for example may be used for wave-delay member 80.

When planar antenna member 78 is applied to an 8-inch wafer, planar antenna member 78 is formed of a disk made of a conductive material with a diameter from 30 to 40 mm and a thickness from 1 to several millimeters, particularly 5 mm for example, or formed of a disk made of a conductive material with a diameter from 300 to 400 mm and a thickness from 1 to several millimeters, particularly 5 mm for example. Specifically, this disk is formed for example of a copper plate or aluminum plate with its surface plated with silver. This disk has a great number of microwave radiation holes 98 formed of circular through holes for example. Microwave radiation holes 98 are arranged over antenna member 78 substantially uniformly. The arrangement of microwave radiation holes 98 is not particularly limited. For example, radiation holes 98 may be arranged concentrically, spirally, or radially. In addition, the shape of microwave radiation holes 98 is not limited to a circle. For example, microwave radiation holes 98 may be in the shape of a long slit or the like, or they may be paired to form the shape of T with a gap therebetween that are accordingly arranged over antenna member 78.

Figure 2:
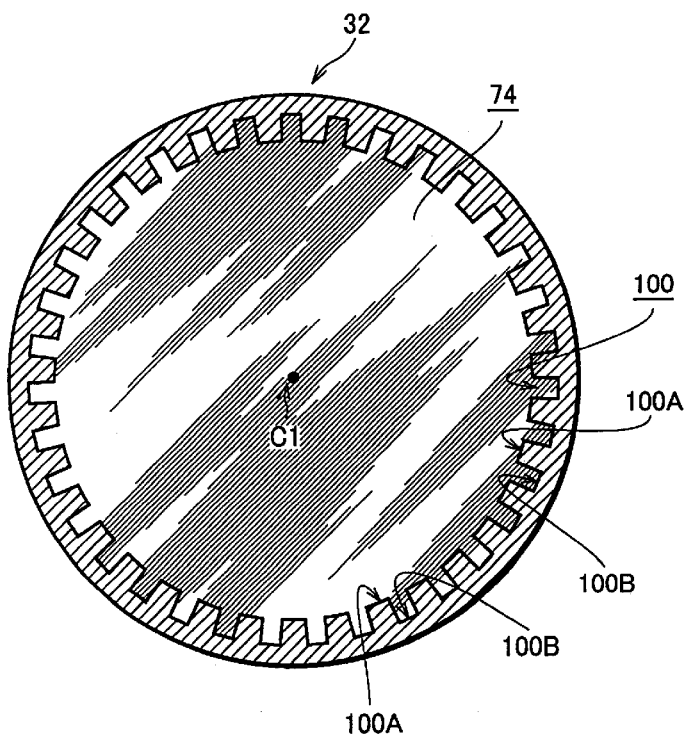
FIG. 2 is a plan view of an insulating plate of the plasma processing apparatus shown in FIG. 1.

Referring to FIG. 2, insulating plate 74 characterizing the present invention has an uneven peripheral shape 100 with depressions and protrusions. In other words, insulating plate 74 is shaped as a whole like a toothed wheel with rectangular protrusions. The inner wall of process chamber 32 is accordingly shaped into depressions and protrusions to be fit in the pattern of uneven peripheral shape 100.

Figure 3:
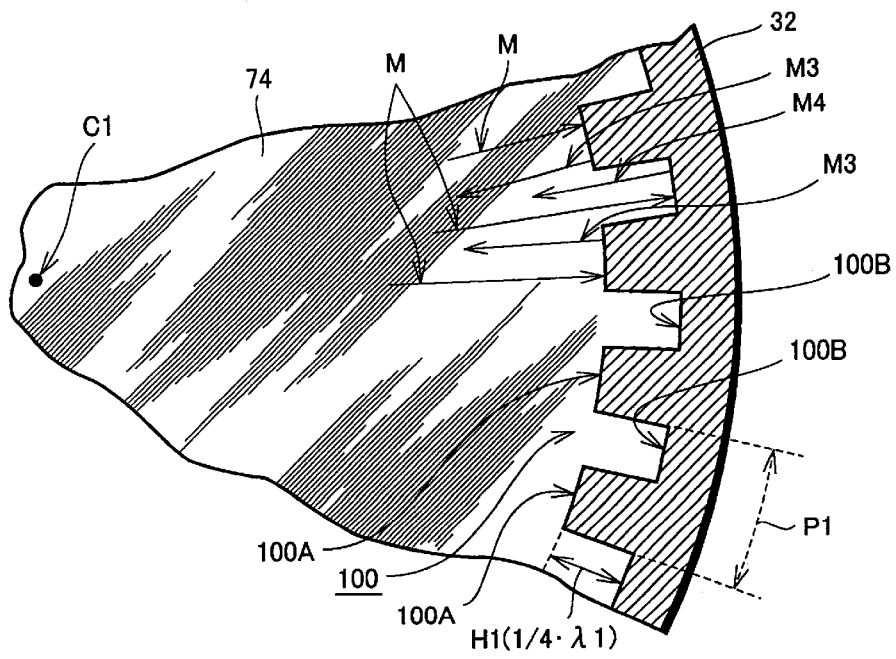
FIG. 3 is a partially enlarged plan view of the insulating plate.

Referring to FIG. 3, depressions 100A and protrusions 100B of peripheral shape 100 each have a depth Hi, i.e., length HI in the direction of the radius of insulating plate 74. Length Hi is set substantially at an odd multiple of a quarter of wavelength $\lambda 1$ of the microwave propagated through insulating plate 74. Here, it is supposed that the frequency of the microwave is 2.45 GHz as described above and insulating plate 74 is made of aluminum nitride (AlN) having a dielectric constant of approximately 8–9. Then, wavelength $\lambda 1$ of the microwave propagated through insulating plate 74 is approximately 41.8 mm. Accordingly, a quarter of this wavelength is 10.45 mm. In this way, length H1 of depression 100A or protrusion 100B is set at a length equal to an odd multiple of a quarter of wavelength $\lambda 1$. Accordingly, a microwave M3 reflected from the end surface of depression 100A and a microwave M4 reflected from the end surface of protrusion 100B adjacent to that depression 100A have a phase difference of substantially ½·$\lambda 1$ (half-wavelength). It is thus possible to allow reflected microwaves M3 and M4 to synergistically cancel out each other and accordingly attenuate.

In this case, a pitch P1 in the circumferential direction of insulating plate 74 between the depressions or protrusions of uneven peripheral shape 100 is set substantially in the range from a quarter to twice as long as wavelength $\lambda 1$. If this pitch P1 is smaller than ¼·$\lambda 1$, the processing of insulating plate 74 increases in complexity and the effect of canceling the reflected waves deteriorates. On the contrary, if pitch P1 is greater than the length twice the wavelength λ1, the effect of canceling reflected waves also deteriorates.

Insulating plate 74 discussed above may be made of alumina ($Al_2O_3$) or quartz ($SiO_2$), for example, except for aluminum nitride. Wavelength λ1 is approximately 37 mm when alumina is used and approximately 67 mm when quartz is used.

A processing method applied to the plasma processing apparatus structured as explained above is described below.

Semiconductor wafer W is first placed in process chamber 32 by a transport arm (not shown) via gate valve 68, and a lifter bin (not shown) is moved up and down to set wafer W on a mount plane on the upper side of mount base 34.

Then, the inside of process chamber 32 is maintained at a predetermined process pressure, for example, in the range from 0.01 to several pascals. Argon gas for example is supplied from plasma gas supply nozzle 48 at a controlled flow rate while deposition gas such as $SiH_4$, $O_2$ and $N_2$ for example is supplied from process gas supply nozzle 50 at a controlled flow rate. Simultaneously, microwave from microwave generator 92 is supplied via waveguide 90 and coaxial waveguide 84 to planar antenna member 78 SO as to provide the microwave with the wavelength shortened by wave-delay member 80 into process space S. Plasma is thus generated to carry out a predetermined plasma process, for example, a film deposition process by plasma CVD.

The microwave of 2.45 GHz for example produced by microwave generator 92 is mode-converted into TEM mode for example, and then propagated within coaxial waveguide 84 to reach planar antenna member 78 in waveguide box 82. The microwave is then propagated from the central part, which is connected to internal cable 84B, radially to the peripheral part of disk-shaped antenna member 78, while the microwave is transmitted through microwave radiation holes 98 and insulating plate 74 to be supplied into process space S directly below antenna member 78. Here, a great number of circular microwave radiation holes 98 are formed and arranged concentrically or spirally and almost uniformly over planar antenna member 78.

The microwave excites the argon gas to generate plasma which diffuses downward. The process gas is accordingly activated to generate an active seed. By the action of the active seed, the surface of wafer W is processed, for example, plasma CVD-processed.

As shown in FIG. 3, a part of the microwave transmitted through insulating plate 74, the part of the microwave being indicated by M, is radially propagated from a central part C1 of insulating plate 74 in the radial direction thereof. In the conventional apparatus, microwave M propagated in the radial direction is reflected from the end surface to be concentrated, with the same phase, at and around the central part of the insulating plate, and the region located at and around the central part has a resultant electric field of the microwave that is considerably high. According to this embodiment, insulating plate 74 has its uneven peripheral shape 100 with depressions and protrusions, so that reflected waves M3 and M4 of microwave M propagated from central part C1 of insulating plate 74 in the radial direction cancel out each other and are substantially extinguished.

Specifically, microwave M propagated in the radial direction is reflected from the end surface of depression 100A and from the end surface of protrusion 100B of uneven peripheral shape 100 as reflected waves M3 and M4 respectively. Here, length H1 of depression 100A or protrusion 100B is set at an odd multiple of (¼·λ1), for example, ¼·λ1. Then, when the microwave is reciprocated once within length Hi, a phase difference of approximately ½·λ1 arises between microwaves M3 and M4 reflected respectively from depression 100A and protrusion 100B adjacent to each other. Consequently, reflected waves M3 and M4 synergistically cancel out each other. Such a canceling action of microwaves M3 and M4 occurs for all waves reflected from the whole peripheral end of insulating plate 74. It is consequently possible that substantially no reflected wave returns to central part C1 of insulating plate 74.

Thus, the microwave and the electric field thereof are never concentrated at and around central part C1 of insulating plate 74, so that a remarkably enhanced planar uniformity of the plasma density in process space S as well as a remarkably enhanced planar uniformity of plasma processing for semiconductor wafer W are achieved.

According to the embodiment described above, the uneven peripheral shape 100 with depressions and protrusions is formed on the peripheral end of insulating plate 74 only. Alternatively, or additionally, such an uneven peripheral shape with depressions and protrusions may be formed on respective peripheral ends of planar antenna member 78 and wave-delay member 80, or at least one of the peripheral ends of respective planar antenna member 78 and wave-delay member 80.

Figure 4:
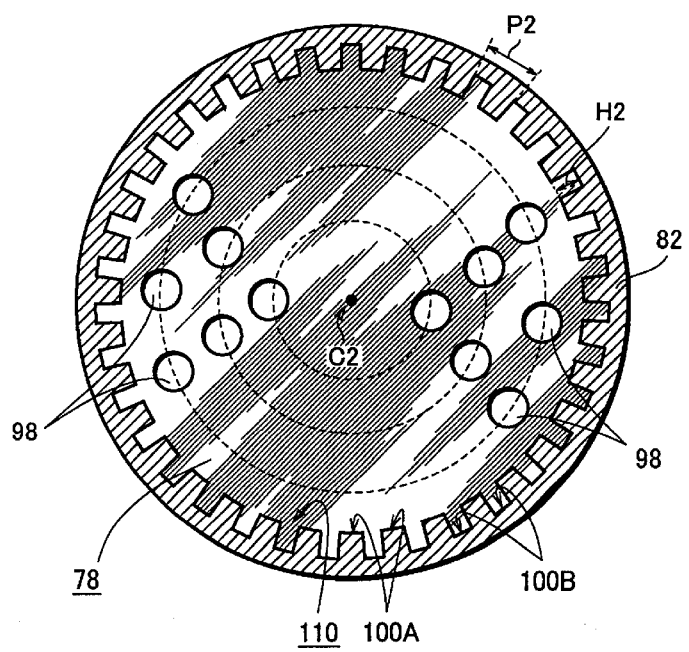
FIG. 4 is a plan view of a planar antenna having its periphery shaped into depressions and protrusions.

Referring to FIG. 4, the peripheral end of planar antenna member 78 including microwave radiation holes 98 is formed into an uneven peripheral shape 110 with depressions and protrusions that is exactly similar to that in structure described with reference to FIG. 2.

A depression 110A or a protrusion 110B of uneven peripheral shape 110 has a length (depth) H2 which is also set substantially at an odd multiple of ¼ of wavelength λ2 of the microwave propagated through wave-delay member 80, not insulating plate 74. Further, a pitch P2 in the circumferential direction of planar antenna member 78 between depressions or protrusions of uneven peripheral shape 110 is set in the range substantially from a quarter to twice as long as wavelength λ2. These settings are as detailed above.

In this case, reflected microwaves respectively from depression 110A and protrusion 110B of uneven shape 110 on the peripheral end of planar antenna member 78 cancel out each other. Then, it is possible to prevent the reflected microwaves from being concentrated at a central part C2 of planar antenna member 78.

Figure 5:
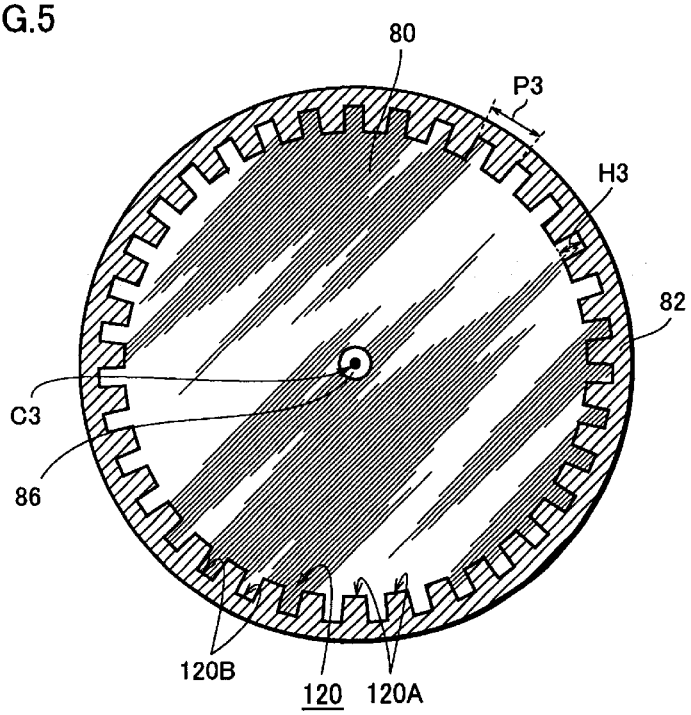
FIG. 5 is a plan view of a wave-delay member having its periphery shaped into depressions and protrusions.
Figure 6:
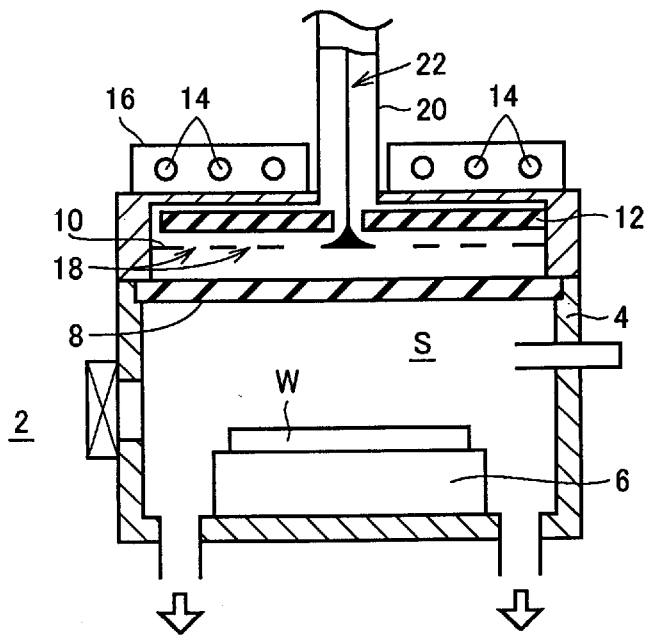
FIG. 6 shows a structure of a conventional and generally employed plasma processing apparatus.
Figure 7:
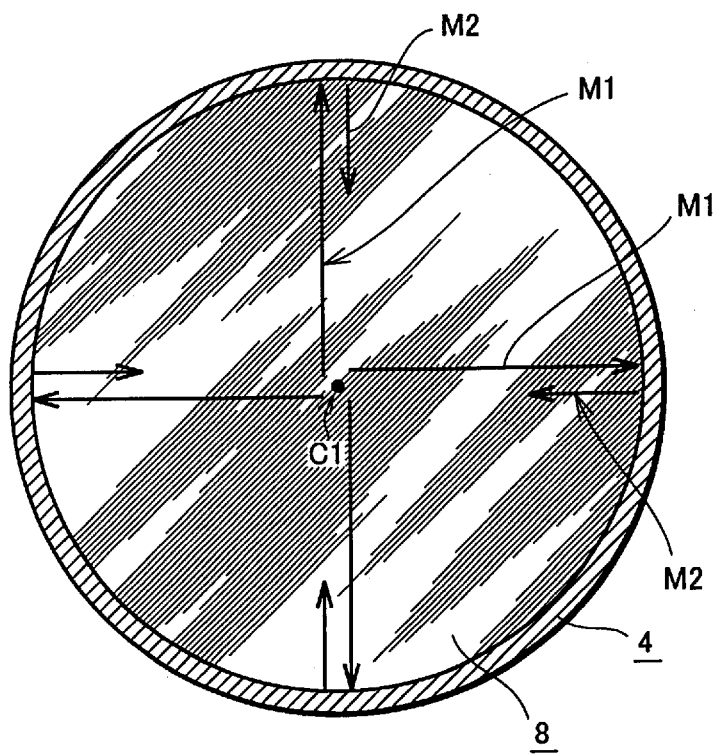
FIG. 7 is a plan view of a conventional insulating plate.

Referring to FIG. 5, the peripheral end of wave-delay member 80 including through hole 86 at the center is formed into an uneven shape 120 which is exactly similar in structure to that described with reference to FIG. 2.

In this case, as described in connection with FIG. 4, a depression 120A or a protrusion 120B of uneven shape 120 has a length (depth) H3 which is also set substantially at an odd multiple of ¼ of wavelength λ2 of the microwave propagated through wave-delay member 80, not insulating plate 74. Further, a pitch P3 in the circumferential direction of wave-delay member 80 between depressions or protrusions of uneven shape 120 is set in the range substantially from a quarter to twice as long as wavelength λ2. These settings are as detailed above in connection with FIG. 2.

Reflected microwaves respectively from depression 120A and 120B of uneven shape 120 on the peripheral end of wave-delay member 80 cancel out each other. Then, it is possible to prevent the reflected microwaves from being concentrated at a central part C3 of wave-delay member 80.

Such a canceling action of the reflected microwaves can be accomplished most effectively to improve the planar uniformity of the plasma density by forming respective peripheral ends of all of the insulating plate 74, planar antenna member 78 and wave-delay member 80 into uneven shapes respectively. However, one or two of these three components may have its (their) peripheral end(s) which may selectively be formed into the uneven shape(s).

The description above of the embodiment of the present invention is applied to the film deposition on a semiconductor wafer. However, the embodiment is not limited thereto and applicable to other plasma processes such as plasma etching and plasma ashing.

In addition, the workpiece to be processed is not limited to the semiconductor wafer, and glass substrate, LCD substrate and the like may be employed as a workpiece.

As heretofore discussed, the plasma processing apparatus according to the present invention exhibits excellent functions and effects as described below.

According to one aspect of the invention, the microwave propagated radially through the insulating plate provided to the process chamber is reflected from the depressions and protrusions on the peripheral end of the insulating plate, so that reflected waves synergistically cancel out each other, which considerably reduces adverse influences of the reflected waves. It is accordingly possible to improve the planar uniformity of plasma processing for a workpiece to be processed.

According to another aspect of the invention, the microwave propagated radially through the planar antenna member is reflected from depressions and protrusions on the peripheral end of the planar antenna member, so that reflected waves synergistically cancel out each other, which considerably reduces adverse influences of the reflected waves. It is accordingly possible to improve the planar uniformity of plasma processing for a workpiece to be processed.

According to still another aspect of the invention, microwave propagated radially through the wave-delay member which reduces the wavelength of the microwave is reflected from depressions and protrusions on the peripheral end of the wave-delay member, so that reflected waves synergistically cancel out each other, which considerably reduces adverse influences of the reflected waves. It is accordingly possible to improve the planar uniformity of plasma processing for a workpiece to be processed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:
   a process chamber including an opened ceiling and an internal space which can be evacuated;
   an insulating plate airtightly attached to the ceiling of said process chamber;
   a mount base placed in said process chamber for mounting thereon a workpiece to be processed;
   a planar antenna member placed above said insulating plate and including a microwave radiation hole for transmitting therethrough microwave used for generating plasma, said microwave transmitted through said insulating plate into said process chamber;
   a wave-delay member placed above said planar antenna member for decreasing the wavelength of microwave; and
   gas supply means for supplying a predetermined gas into said process chamber, wherein said insulating plate has its peripheral end formed into an uneven shape with depressions and protrusions for causing, reflected waves of the microwave propagated through said insulating plate from the center and in the radial direction of said insulating plate, to cancel out each other.

2. The plasma processing apparatus according to claim 1, wherein
   the depressions and protrusions of said uneven shape each have a length in the radial direction of said insulating plate, and the length is substantially equal to an odd multiple of a quarter of the wavelength of the microwave propagated through said insulating plate.

3. The plasma processing apparatus according to claim 1, wherein
   a pitch, in the circumferential direction of said insulating plate, between the depressions or protrusions of said uneven shape substantially ranges from a quarter to twice as long as the wavelength of the microwave propagated through said insulating plate.

4. A plasma processing apparatus comprising:
   a process chamber including an opened ceiling and an internal space which can be evacuated;
   an insulating plate airtightly attached to the ceiling of said process chamber;
   a mount base placed in said process chamber for mounting thereon a workpiece to be processed;
   a planar antenna member placed above said insulating plate and including a microwave radiation hole for transmitting therethrough microwave used for generating plasma, said microwave transmitted through said insulating plate into said process chamber;
   a wave-delay member placed above said planar antenna member for decreasing the wavelength of microwave; and
   gas supply means for supplying a predetermined gas into said process chamber, wherein
   said planar antenna member has its peripheral end formed into an uneven shape with depressions and protrusions for causing, reflected waves of the microwave propagated through said planar antenna member from the center and in the radial direction of said planar antenna member, to cancel out each other.

5. The plasma processing apparatus according to claim 4, wherein
   the depressions and protrusions of said uneven shape each have a length in the radial direction of said planar antenna member, and the length is substantially equal to an odd multiple of a quarter of the wavelength of microwave propagated through said wave-delay member.

6. The plasma processing apparatus according to claim 4, wherein
   a pitch, in the circumferential direction of said planar antenna member, between the depressions or protrusions of said uneven shape substantially ranges from a quarter to twice as long as the wavelength of microwave propagated through said wave-delay member.

7. A plasma processing apparatus comprising:
   a process chamber including an opened ceiling and an internal space which can be evacuated;
   an insulating plate airtightly attached to the ceiling of said process chamber;
   a mount base placed in said process chamber for mounting thereon a workpiece to be processed;

a planar antenna member placed above said insulating plate and including a microwave radiation hole for transmitting therethrough microwave used for generating plasma, said microwave transmitted through said insulating plate into said process chamber;

a wave-delay member placed above said planar antenna member for decreasing the wavelength of microwave; and gas supply means for supplying a predetermined gas into said process chamber, wherein said wave-delay member has its peripheral end formed into an uneven shape with depressions and protrusions for causing, reflected waves of microwave propagated through said wave-delay member from the center and in the radial direction of said wave-delay member, to cancel out each other.

8. The plasma processing apparatus according to claim 7, wherein the depressions and protrusions of said uneven shape each have a length in the radial direction of said wave-delay member, and the length is substantially equal to an odd multiple of a quarter of the wavelength of the microwave propagated through said wave-delay member.

9. The plasma processing apparatus according to claim 7, wherein a pitch, in the circumferential direction of said wave-delay member, between the depressions or protrusions of said uneven shape substantially ranges from a quarter to twice as long as the wavelength of the microwave propagated through said wave-delay member.

* * * * *

UNITED STATES PATENT AND TRADEMARK OFFICE
CERTIFICATE OF CORRECTION

PATENT NO. : 6,675,737 B2
DATED : January 13, 2004
INVENTOR(S) : Toshiaki Hongoh et al.

It is certified that error appears in the above-identified patent and that said Letters Patent is hereby corrected as shown below:

<u>Title page,</u>
Item [73], after "Assignee: Tokyo Electron Limited, Tokyo (JP)," please add
-- Tadahiro Ohmi, Miyagi (JP) -- as the second Assignee.

Signed and Sealed this

Twenty-third Day of March, 2004

JON W. DUDAS
*Acting Director of the United States Patent and Trademark Office*